(12) United States Patent
Hamada et al.

(10) Patent No.: US 11,101,772 B2
(45) Date of Patent: Aug. 24, 2021

(54) MIXER CIRCUIT

(71) Applicant: Nippon Telegraph and Telephone Corporation, Tokyo (JP)

(72) Inventors: Hiroshi Hamada, Tokyo (JP); Teruo Jo, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/976,645

(22) PCT Filed: Feb. 13, 2019

(86) PCT No.: PCT/JP2019/005013
§ 371 (c)(1),
(2) Date: Aug. 28, 2020

(87) PCT Pub. No.: WO2019/167619
PCT Pub. Date: Sep. 6, 2019

(65) Prior Publication Data
US 2020/0412300 A1    Dec. 31, 2020

(30) Foreign Application Priority Data
Mar. 1, 2018    (JP) .............................. JP2018-036201

(51) Int. Cl.
*H03D 7/14*    (2006.01)
*H03D 7/12*    (2006.01)
(52) U.S. Cl.
CPC ........... *H03D 7/125* (2013.01); *H03D 7/1441* (2013.01); *H03D 7/1466* (2013.01)

(58) Field of Classification Search
CPC ........... H03D 7/12; H03D 7/125; H03D 7/14; H03D 7/1425; H03D 7/1433;
(Continued)

(56) References Cited

U.S. PATENT DOCUMENTS

| | | | |
|---|---|---|---|
| 5,396,132 A * | 3/1995 | Shiga .................... | H03D 7/125 257/269 |
| 8,183,896 B2 * | 5/2012 | Jung ..................... | H03D 7/125 327/116 |

(Continued)

FOREIGN PATENT DOCUMENTS

| | | |
|---|---|---|
| JP | S5352336 | 5/1978 |
| JP | 2007184862 | 7/2007 |
| JP | 201546741 | 3/2015 |

OTHER PUBLICATIONS

Radmanesh, Matthew M. et al., "State of the Art S-band Resistive FET Mixer Design," May 23, 1994, pp. 1435-1438.

*Primary Examiner* — Long Nguyen
(74) *Attorney, Agent, or Firm* — Slater Matsil, LLP

(57) ABSTRACT

A resistive mixer includes a LO matching circuit inserted between the gate of an FET and a LO terminal, a bias circuit that is connected to the gate and applies a bias voltage to the gate, an RF matching circuit inserted between the drain of the FET and an RF terminal, and an IF matching circuit inserted between the drain and an IF terminal. The source of the FET is grounded. The impedance of the RF matching circuit seen from the drain of the FET at an IF frequency is open-circuit, and the impedance of the IF matching circuit seen from the drain of the FET at an RF frequency is open-circuit.

17 Claims, 7 Drawing Sheets

(58) Field of Classification Search
CPC .... H03D 7/1441; H03D 7/145; H03D 7/1458; H03D 7/1466; H03D 7/1475; H03D 7/1483; H03D 7/1491
See application file for complete search history.

(56) References Cited

U.S. PATENT DOCUMENTS

| | | |
|---|---|---|
| 2006/0141976 A1 | 6/2006 | Rohde et al. |
| 2009/0181634 A1* | 7/2009 | Jung .................. H03D 7/125 455/333 |
| 2016/0181678 A1 | 6/2016 | Robert et al. |

* cited by examiner

PRIOR ART

MIXER CIRCUIT

CROSS-REFERENCE TO RELATED APPLICATIONS

This application is a national phase entry based PCT Application No. PCT/JP2019/005013, filed on Feb. 13, 2019 which claims priority to Japanese Application No. 2018-036201, filed on Mar. 1, 2018, which applications are hereby incorporated herein by reference.

TECHNICAL FIELD

The present invention relates to a mixer circuit for a high-frequency electrical signal.

BACKGROUND

Mixers are widely used as high-frequency components having a frequency conversion function. Such mixers are used to perform frequency conversion between an intermediate frequency (referred to as an "IF frequency" hereinafter) and an RF frequency used in the heterodyne system commonly adopted in recent radio communications, for example. The mixers are also a basic component of a radio system that is responsible for frequency conversion between a measurement frequency and the IF frequency in a spectrum analyzer, for example.

The mixer is implemented by a semiconductor device such as a Schottky barrier diode (SBD) or a transistor. When the mixer is incorporated in a radio or measuring instrument as a component, it is often required to integrate the mixer with other circuit elements for the purpose of cost reduction. As a mixer incorporated in a radio or measuring instrument as a component, a mixer incorporating a transistor that is highly suitable for integration, such as a field effect transistor (FET) or a bipolar transistor, is suitable.

Conventionally, in applications where high power is measured by a measuring instrument or the like or where low distortion characteristics are required, such as in frequency conversion of a multilevel modulation signal, resistive mixers having high linearity are used among other transistor-based mixers (see Patent Literature 1).

FIG. 14 is a block diagram showing a configuration of a resistive mixer as an example of conventional mixers. In principle, the resistive mixer can be implemented by both the FET, which is voltage-controlled, and the bipolar transistor, which is current-controlled. In the following, examples where the resistive mixer is implemented by an FET will be described, for the purpose of simplicity. By substituting the terms "gate", "drain" and "source" in the following description with terms "base", "collector" and "emitter", the explanation below applies to cases where the resistive mixer is implemented by a bipolar transistor.

As shown in FIG. 14, the conventional resistive mixer incorporates an FET with the source grounded. A high-frequency signal (referred to as an "RF signal" hereinafter) and an intermediate frequency signal (referred to as an "IF signal" hereinafter) are input to the drain of the FET. A local oscillation signal (referred to as an "LO signal" hereinafter) is input to the gate of the FET.

In the down conversion operation in which frequency conversion from the RF signal to the IF signal occurs, the drain-source resistance (denoted as "Rds" hereinafter) of the FET is changed by the LO signal, thereby making the impedance of the drain of the FET to the RF signal input to the drain substantially change. In this way, the RF signal is switched by the LO signal, and the IF signal having the difference frequency is generated.

On the other hand, in the up conversion operation in which frequency conversion from the IF signal to the RF signal occurs, the IF signal is switched by the LO signal, and the RF signal is generated.

In general, the gate of the FET is biased to a vicinity of the threshold of the FET at which the change of Rds in response to the LO signal is at the maximum. In addition, a RF terminal, an LO terminal and an IF terminal to which the RF signal, the LO signal and the IF signal are input, respectively, are each provided with a matching circuit that allows the signal to be input and output with low loss.

Such a resistive mixer is characterized by a high linearity and uses the linear region of the FET rather than the saturation region of the FET, which would otherwise be used, in the amplification operation. For example, with a mixer that operates in the saturation region of the FET as with an amplifier, such as a gate-injected mixer or a drain-injected mixer, the change of the transconductance (gm) of the FET due to the LO signal contributes to the frequency conversion.

However, the resistive mixer operates in the linear region, and therefore, the change of Rds due to the LO signal contributes to the frequency conversion. Rds is less sensitive to the RF power or IF power input to the drain than gm in the saturation region, and accordingly, high input linearity is achieved.

As can be seen from the principle of operation, the rate of change of $R_{ds}$ due to the LO signal plays an extremely important role in the operation of the resistive mixer. Ideally, by switching the characteristics of the FET between a completely off state (where $R_{ds}$ is $\infty$) and a complete on state (where $R_{ds}$ is 0), the impedance of the drain seen from the RF signal can be switched between complete open-circuit and complete short-circuit. Such an ideal switching operation results in high conversion gain.

For this reason, in order to achieve high conversion gain, it is important to ensure sufficiently high impedances of the RF matching circuit and the IF matching circuit seen from the IF signal and the RF signal, respectively, that is, to highly isolate the two matching circuits from each other.

CITATION LIST

Patent Literature

Patent Literature 1: Japanese Patent Laid-Open No. 2015-46741

Non-Patent Literature

Non-Patent Literature 1: Matthew M. Radmanesh et al., "State of the Art S-band Resistive FET Mixer Design", Microwave Symposium Digest, 1994, IEEE MTT-S International.

SUMMARY

Technical Problem

With the conventional resistive mixer, the conversion gain decreases due to the RF matching circuit and the IF matching circuit loaded on the drain of the FET, and therefore, it is generally difficult to the ideal switching operation described above.

In addition, when the frequency bands of the RF signal and the IF signal significantly differ from each other, such as when a frequency band equal to or higher than 100 GHz is used for the RF signal and a DC signal or a signal having a frequency of up to about 60 GHz is used as the IF signal, if the RF matching circuit and the IF matching circuit are not isolated, another problem also occurs when the mixer circuit is packaged.

The problem is that, due to different interfaces to the RF matching circuit and IF matching circuit packaged, the operation of the mixer circuit packaged significantly differs from the operation of the mixer circuit as a chip before packaging.

Embodiments of the present invention have been devised to solve the problems described above, and an object of embodiments of the present invention is to provide a mixer circuit that can have an increased conversion gain and be prevented from being degraded in characteristics when the mixer circuit is packaged.

Means for Solving the Problem

To solve the problems described above, a mixer circuit according to embodiments of the present invention is a mixer circuit including: a transistor having a control terminal, a first output terminal and a second output terminal; an LO terminal that is connected to the control terminal and to which a local oscillation signal is input; an RF terminal that is connected to the first output terminal and from which a high-frequency signal is output; an IF terminal that is connected to the first output terminal and from which an intermediate frequency signal is output; an LO matching circuit inserted between the control terminal and the LO terminal; a bias circuit that is connected to the control terminal and applies a bias voltage to the control terminal; an RF matching circuit inserted between the first output terminal and the RF terminal; and an IF matching circuit inserted between the first output terminal and the IF terminal, wherein the second output terminal is grounded, and a first impedance of the RF matching circuit seen from the first output terminal at an intermediate frequency is open-circuit, and a second impedance of the IF matching circuit seen from the first output terminal at an RF frequency is open-circuit.

In the mixer circuit according to embodiments of the present invention, the RF matching circuit may have: a first distributed constant circuit having a plurality of transmission lines; and a series capacitor connected in series to the first distributed constant circuit, the series capacitor may be connected to the first output terminal of the transistor at one end thereof and to the first distributed constant circuit at another end thereof, the series capacitor may have a third impedance that is sufficiently low with respect to the RF frequency and sufficiently high with respect to the intermediate frequency, and the IF matching circuit may include: a second distributed constant circuit having a plurality of transmission lines; a first transmission line that has a length equal to a quarter wave at the RF frequency and is connected between the second output terminal of the transistor and the second distributed constant circuit; and a second transmission line that has a length equal to a quarter wave at the RF frequency and is provided at a connection point at which the first transmission line is connected to the second distributed constant circuit and is open at one end thereof.

In the mixer circuit according to embodiments of the present invention, the RF matching circuit may have: a first distributed constant circuit having a plurality of transmission lines; a third transmission line that has a length equal to a quarter wave at the intermediate frequency and is connected between the first output terminal of the transistor and the first distributed constant circuit; and a fourth transmission line that has a length equal to a quarter wave at the intermediate frequency, is provided at a connection point at which the third transmission line is connected to the first distributed constant circuit, and is open at one end thereof, and the IF matching circuit may include: a second distributed constant circuit having a plurality of transmission lines; a first transmission line that has a length equal to a quarter wave at the RF frequency and is connected between the second output terminal of the transistor and the second distributed constant circuit; and a second transmission line that has a length equal to a quarter wave at the RF frequency, is provided at a connection point at which the first transmission line is connected to the second distributed constant circuit, and is open at one end thereof.

In the mixer circuit according to embodiments of the present invention, the first distributed constant circuit of the RF matching circuit may include a plurality of transmission lines that are open at one end thereof.

In the mixer circuit according to embodiments of the present invention, the second distributed constant circuit of the IF matching circuit may include a plurality of transmission lines that are open at one end thereof.

In the mixer circuit according to embodiments of the present invention, the transistor may be a field effect transistor.

Effects of Embodiments of the Invention

According to embodiments of the present invention, by sufficiently increasing the impedance of the RF matching circuit seen from the IF signal and the impedance of the IF matching circuit seen from the RF signal, the conversion gain of the mixer circuit can be increased, and the mixer circuit can be prevented from being degraded in characteristics when the mixer circuit is packaged.

DETAILED DESCRIPTION OF ILLUSTRATIVE EMBODIMENTS

In the following, preferred embodiments of the present invention will be described in detail with reference to FIGS. 1 to 13. Note that the transistors mentioned in the following description are FETs.

Principle of Embodiments of Invention

First, the principle of a mixer circuit configured as a resistive mixer according to embodiments of the present invention will be described.

First, a cause of the reduction of the conversion gain due to a matching circuit of the mixer circuit and the principle of improving the conversion gain of the mixer circuit according to embodiments of the present invention as a solution to the problem will be described in detail with regard to a down conversion operation, for example.

In the down conversion operation, in order to achieve higher conversion gain of the mixer circuit, it is desirable to sufficiently modulate $R_{ds}$ to substantially change the impedance of the drain of the FET seen from the RF signal. In this regard, an equivalent circuit of the drain and its surroundings seen from the RF signal can be expressed in the "DOWN CONVERSION MODE" column in FIG. 1.

Figure 1:
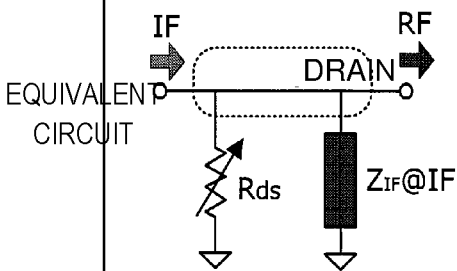
FIG. 1 is a diagram for illustrating an example of operation modes of a resistive mixer.

More specifically, as shown in FIG. 1, an impedance of an IF matching circuit seen from an RF signal is denoted as "$Z_{IF}@RF$". $Z_{IF}@RF$ is inserted in parallel with $R_{ds}$ when viewed from an RF terminal. Therefore, an impedance $Z_{mixer}$ of the drain of the FET seen from the RF signal is expressed by the following Formula (1).

[Formula 1]

$$Z_{mixer} = R_{ds} \| Z_{IF}@RF = \frac{R_{ds}Z_{IF}@RF}{R_{ds}+Z_{IF}@RF} = \frac{R_{ds}}{1+\frac{R_{ds}}{Z_{IF}@RF}} \quad (1)$$

Figure 2:
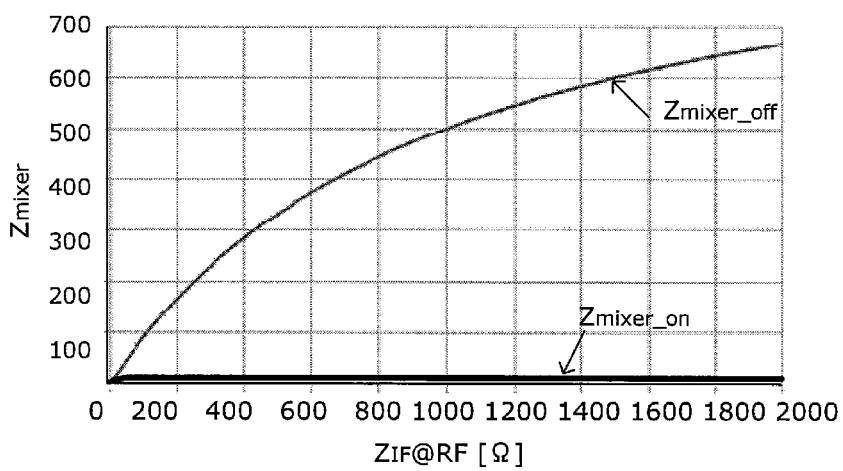
FIG. 2 is a diagram for illustrating a relationship between $Z_{mixer}$ and $Z_{IF}$@RF of the resistive mixer.

As described above, in order to ensure high conversion gain of the mixer circuit in the down conversion operation, it is important to ensure high rate of change of $Z_{mixer}$. To examine the effect of $Z_{IF}@RF$ on $Z_{mixer}$, the value of $Z_{IF}@RF$ is changed from 1Ω to 2000Ω, provided that $R_{ds}$ assumes 10Ω in the on state and assumes woo n in the off state. FIG. 2 shows a result of calculation of $Z_{mixer}$ in this case.

As shown in FIG. 2, when the impedance $Z_{IF}@RF$ of the IF matching circuit seen from the RF signal is low, an impedance $Z_{mixer}$ off at the time when $R_{ds}$ is in the off state cannot be increased, so that the on/off ratio is small.

Figure 3:
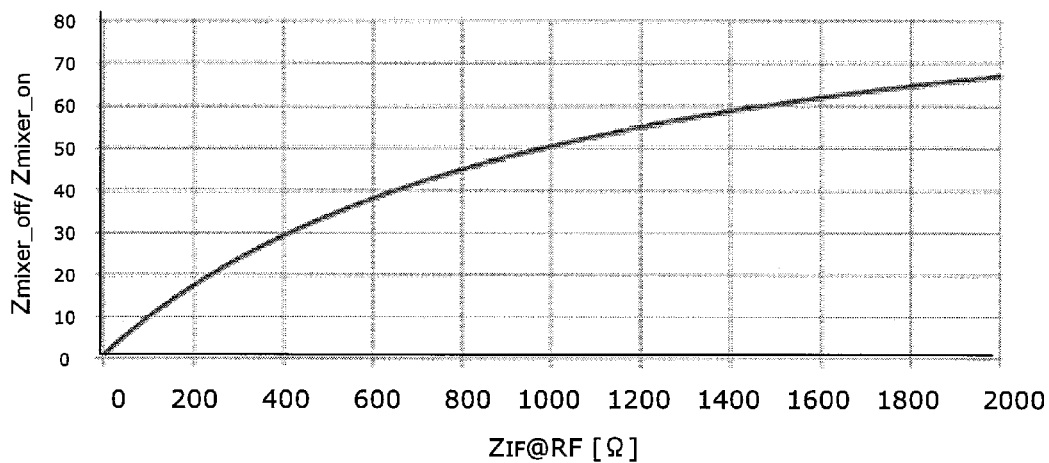
FIG. 3 is a diagram for illustrating an on/off ratio of the resistive mixer.

FIG. 3 shows a result of calculation of the on/off ratio, which is $Z_{mixer}$ at the time when $R_{ds}$ is in the off state normalized with $Z_{mixer}$ on at the time when $R_{ds}$ is in the on state. As shown in FIG. 3, if the $Z_{IF}@RF$ is 50Ω, which is commonly used in the high-frequency circuit design, the on/off ratio is as low as about 5.7.

As shown in FIG. 2, $R_{ds}$ is 10Ω in the on state and 1000Ω in the off state. Therefore, the on/off ratio should be 100 if there is not the IF matching circuit. This shows that the reduction of the on/off ratio of the $Z_{IF}@RF$ has a great influence on the frequency conversion operation of the mixer circuit. Similarly, in the up conversion operation of the mixer circuit, the on/off ratio decreases because of the impedance $Z_{RF}@IF$ of the RF matching circuit seen from the IF signal, and the conversion gain of the mixer circuit decreases.

In view of such circumstances, the inventors have improved the conversion gain of the mixer circuit by considering the impedance of the RF matching circuit seen from the IF signal and the impedance of the IF matching circuit seen from the RF signal, which have been neglected in the conventional resistive mixer.

Next, a solution to a second problem with the conventional resistive mixer will be described. The problem is caused by different interfaces to the RF matching circuit and IF matching circuit packaged. In other words, the problem is that the operation of the mixer circuit packaged significantly differs from the operation of the mixer circuit as a chip. The principle of embodiments of the present invention as a solution to this problem will be described below in more detail.

Typically, at frequencies equal to or higher than 100 GHz, the interface to the mixer circuit packaged is a waveguide. At frequencies of up to about 60 GHz, the interface to the mixer circuit packaged is a coaxial line, such as a V-connector.

The waveguide generally exhibits high-pass characteristics, and therefore serves as a reflector to signals having frequencies equal to or lower than the cut-off frequency thereof. On the other hand, the coaxial line generally exhibits low-pass characteristics, and therefore serves as a reflector to signals having frequencies equal to or higher than the cut-off frequency thereof.

As described above, if the RF matching circuit is not adequately isolated from the IF signal, such as in the up conversion operation, the IF signal reaches the waveguide, which is the interface to the RF signal, when the mixer circuit is packaged. The IF signal having reached the waveguide is reflected by the waveguide, returns to the mixer circuit and interferes with the input IF signal. Therefore, in general, the returned IF signal has an adverse effect, such as causing a ripple in the frequency characteristics of the conversion gain of the mixer circuit. The same phenomenon occurs in the down conversion operation.

Consider a case where a grounded transistor, such as a well-known ridge coupler, is used in the connector between the waveguide and the integrated circuit (see Patent Literature 1). In that case, the ridge coupler portion appears to be grounded to the waveguide wall via an extremely low inductance when seen from the IF signal. Therefore, the IF signal is grounded at the ridge coupler portion before exiting the connector and cannot be extracted to the outside, and the conversion gain of the resistive mixer substantially decreases.

In order to suppress such an influence and achieve the same characteristics as those of the mixer circuit as a chip when the mixer circuit is packaged, it is important to sufficiently raise the impedances of the IF matching circuit and the RF matching circuit seen from the RF signal and the IF signal so that the interface to the IF matching circuit cannot be seen from the RF signal and the interface to the RF matching circuit cannot be seen from the IF terminal in the packaged condition.

There are some conventional techniques that involve attaching a matching circuit, a filter or a diplexer to each of the RF terminal and the IF terminal. However, as described above, the inventors consider that the impedance of a matching circuit, which is an additional circuit, needs to be distinctly raised when the additional circuit is seen at a different frequency. Based on this consideration, the inventors have provided a mixer circuit that can achieve the same mixer characteristics as those of the mixer circuit as a chip when the mixer circuit is packaged.

As described above, in order to improve the conversion gain of the mixer circuit and to maintain the mixer characteristics when the mixer circuit is packaged, the mixer circuit according to embodiments of the present invention adopts a configuration in which the RF matching circuit and the IF matching circuit are highly isolated from each other.

First Embodiment

In the following a resistive mixer 10 according to a first embodiment of the present invention will be described. The resistive mixer 10 according to this embodiment described below is a mixer circuit for a 300 GHz band, for example. In the following description, the "RF frequency" is a frequency of 250 GHz to 300 GHz, the "LO frequency" is a frequency of 240 GHz, and the "IF frequency" is a frequency of 10 GHz to 60 GHz.

Figure 4:
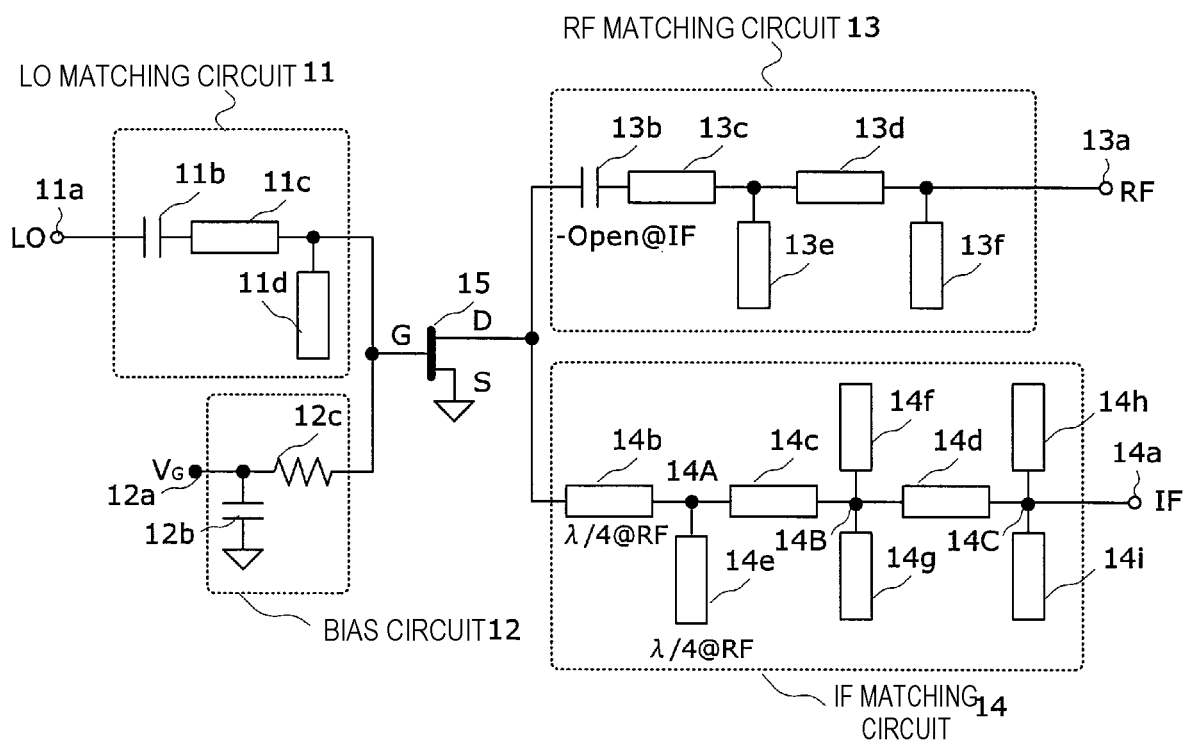
FIG. 4 is a diagram showing a configuration of a resistive mixer according to a first embodiment of the present invention.
Figure 5:
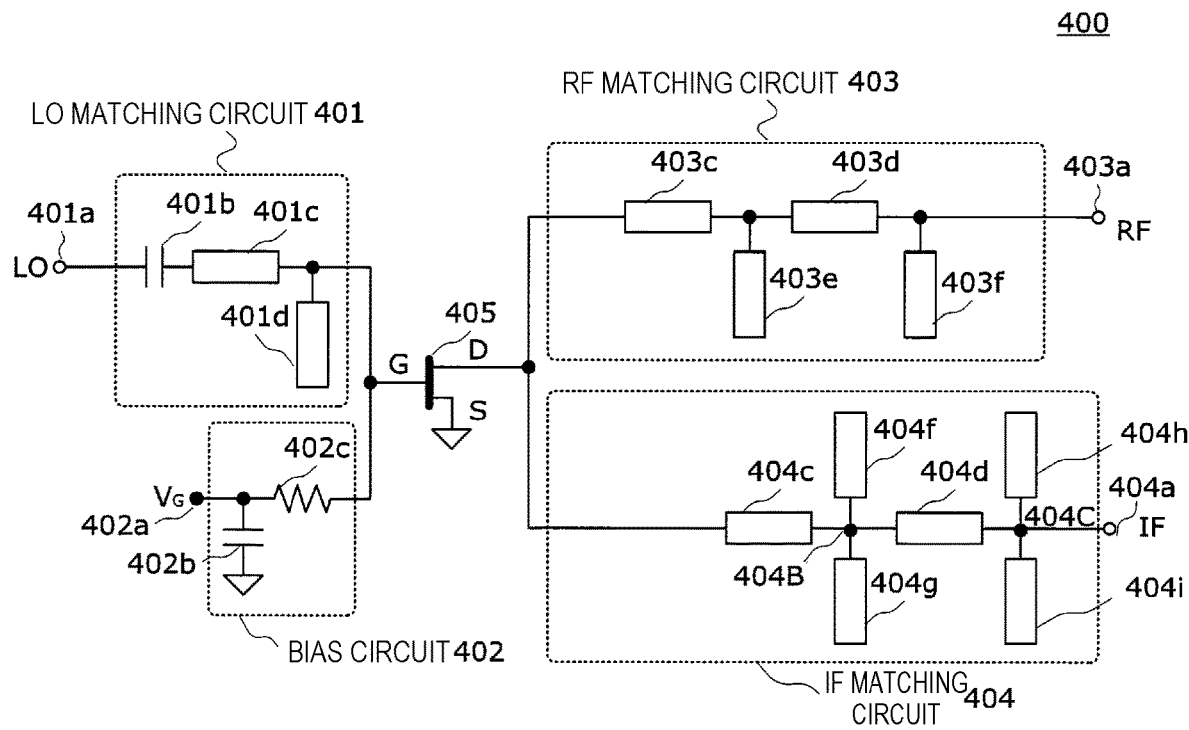
FIG. 5 is a diagram showing a configuration of a conventional resistive mixer as a comparative example.

FIG. 4 is a diagram showing an example of a configuration of the resistive mixer 10 according to this embodiment. FIG. 5 is a diagram showing an example of a configuration of a conventional resistive mixer 400 for comparison.

As shown in FIG. 4, the resistive mixer 10 includes a LO matching circuit 11, a bias circuit 12, an RF matching circuit 13, an IF matching circuit 14 and an FET 15. In the resistive mixer 10, an LO signal is input to a gate (control terminal) of the FET 15, which is grounded at a source thereof, and an RF signal and an IF signal are input to and output from a drain (first output terminal) of the FET 15 grounded at the source (second output terminal) thereof.

The LO matching circuit 11 is connected to a LO terminal 11a to which the LO signal is input. The LO signal input to the LO terminal 11a is input to the gate of the FET 15 grounded at the source thereof through the LO matching circuit 11.

The LO matching circuit 11 has a transmission line 11c, a series capacitor 11b connected in series to the transmission line 11c, and an open stub 11d, which is a transmission line that is open at one end. The configuration of the LO matching circuit 11 is just an example, and any other configuration that can provide the same matching function can be used.

The open stub 11d used in this embodiment has an impedance $Z_{11d}$ of 40Ω and an electrical length of 60° at 300 GHz. The transmission line 11c used in this embodiment has an impedance $Z_{11c}$ of 45Ω and an electrical length of 35° at 300 GHz. The series capacitor 11b used in this embodiment has a capacitance of 9.5 fF.

The bias circuit 12 has a capacitor 12b and a resistor 12c, and a gate bias voltage $V_G$ is applied to the bias circuit 12 through a bias terminal 12a. A gate voltage of the FET 15 needs to be set at a value of a bias with which a drain-source resistance $R_{ds}$ of the FET 15 is most significantly changed by the applied LO signal, or more generally, a value in the vicinity of a threshold of the FET 15.

The capacitor 12b and the resistor 12c of the bias circuit 12 of the resistive mixer 10 shown in FIG. 4 have a capacitance of 200 fF and a resistance of 300Ω, respectively, and the bias circuit 12 applies a threshold voltage to the gate of the FET 15.

With the resistive mixer 10, the FET 15 operates in a linear region, and therefore the drain-source voltage is 0 V. Therefore, no voltage needs to be applied to the drain of the FET 15, and no bias circuit is required on the side of the drain.

The RF matching circuit 13 is inserted between the drain of the FET 15 and an RF terminal 13a. The RF matching circuit 13 has a distributed constant circuit (first distributed constant circuit) having transmission lines 13c and 13d and open stubs 13e and 13f, and a series capacitor 13b connected in series to the distributed constant circuit.

The series capacitor 13b is connected to the drain of the FET 15 at one end thereof and to the transmission line 13c at the other end thereof. The series capacitor 13b has an impedance value that is sufficiently small with respect to the RF frequency and is sufficiently large with respect to the IF frequency.

Since the RF matching circuit 13 has such a series capacitor 13b, an impedance $Z_{13}$@IF of the RF matching circuit 13 seen from the IF signal is open-circuit (open@IF).

As for parameter values of the RF matching circuit 13, the transmission line 13c connected to the drain of the FET 15 has an impedance $Z_{13c}$ of 53Ω and an electrical length of 27° at 300 GHz. The open stub 13e closer to the drain of the FET 15 has an impedance $Z_{13e}$ of 60Ω and an electrical length of 30°.

The transmission line 13d has an impedance $Z_{13d}$ of 70Ω and an electrical length of 260° at 300 GHz. The open stub 13f connected to the RF terminal 13a has an impedance $Z_{13f}$ of 65Ω and an electrical length of 263°.

Next, the IF matching circuit 14 will be described.

The IF matching circuit 14 is inserted between the drain of the FET 15 and an IF terminal 14a. The IF matching circuit 14 includes a distributed constant circuit (second distributed constant circuit) having transmission lines 14c and 14d and open stubs 14f, 14g, 14h and 14i, a quarter-wave line 14b (first transmission line), and a quarter-wave open stub 14e (second transmission line).

More specifically, the IF matching circuit 14 has two open stubs 14f and 14g connected to a connection point 14B between transmission lines 14c and 14d, and two open stubs 14h and 14i connected to a connection point 14C between a transmission line 14d and the IF terminal 14a.

The IF matching circuit 14 further has a quarter-wave line 14b (λ/4@RF) for quarter-wave impedance transformation between the drain of the FET 15 and the transmission line 14c. The IF matching circuit 14 further has a quarter-wave open stub 14e (λ/4@RF) provided at a connection point 14A between the quarter-wave line 14b and the transmission line 14c.

Since the IF matching circuit 14 has the quarter-wave line 14b and the quarter-wave open stub 14e, an impedance $Z_{14}$@IF of the IF matching circuit seen from the RF signal is open-circuit.

As for specific parameter values, in this embodiment, the quarter-wave line 14b and the quarter-wave open stub 14e each have an electrical length of 90° at 300 GHz, and the values of impedances $Z_{14b}$ and $Z_{14e}$ thereof are 50Ω for ease of explanation. The values of the impedances $Z_{14b}$ and $Z_{14e}$ are not limited to 50Ω, and the impedances $Z_{14b}$ and $Z_{14e}$ can assume any value that is possible for the transmission lines and has no influence on the operation of the subsequent portion of the IF matching circuit 14.

The transmission line 14c connected to the drain of the FET 15 has an impedance $Z_{14c}$ of 70Ω and an electrical length of 27° at 300 GHz. The two open stubs 14f and 14g provided in parallel at the connection point 14B at which the transmission lines 14c and 14d are connected to each other have impedances $Z_{14f}$ and $Z_{14g}$ of 53Ω, respectively, and an electrical length of 30°.

The transmission line 14d has an impedance $Z_{14d}$ of 70Ω and an electrical length of 27°. The two open stubs 14h and 14i provided in parallel at the connection point 14C between the transmission line 14d and the IF terminal 14a have impedances $Z_{14h}$ and $Z_{14i}$ of 53Ω, respectively, and an electrical length of 30°.

As shown in FIG. 4, when the IF matching circuit 14 at the RF frequency is viewed from the side of the drain of the FET 15, the connection point 14A to which the quarter-wave open stub 14e of the IF matching circuit 14 is connected is a voltage node (virtual short-circuit point). Thus, regardless of the impedance of the part of the IF matching circuit 14 closer to the IF terminal 14a than the connection point 14A, an impedance $Z_{14}$@RF of the IF matching circuit 14 to the RF signal seen from the connection point 14A is 0.

Therefore, the part of the IF matching circuit 14 closer to the IF terminal 14a than the connection point 14A is cut off from the RF signal. Furthermore, because of the quarter-wave line 14b inserted between the drain of the FET 15 and the connection point 14A, the drain of the FET 15 is a voltage anti-node (virtual open-circuit point) at the RF frequency.

Therefore, when the IF matching circuit 14 is viewed from the drain of the FET 15, the impedance $Z_{14}$@RF of the IF matching circuit 14 ideally appears to be ∞ (open-circuit). In this way, the IF matching circuit 14 can be completely cut off from the RF signal.

With the RF matching circuit 13 configured as described above, similarly, an impedance $Z_{13}$@IF of the RF matching circuit 13 to the IF signal is also sufficiently increased. According to this embodiment, taking advantage of the fact that the frequency band of the IF signal and the frequency band of the RF signal are substantially separated from each other, the RF matching circuit 13 is cut off from the IF signal by using the series capacitor 13b that sufficiently increases the impedance $Z_{13}$@RF to the IF signal. The series capacitor 13b has a capacitance of 10 fF, for example.

The resistive mixer 400 according to a current example, which is a comparative example, shown in FIG. 5 includes an LO matching circuit 401, a bias circuit 402, an RF matching circuit 403, an IF matching circuit 404 and an FET 405. The resistive mixer 400 according to the current example differs from the resistive mixer 10 according to this embodiment in that the RF matching circuit 403 does not have the series capacitor 13b, and the IF matching circuit 404 does not have the quarter-wave line 14b and the quarter-wave open stub 14e.

The LO matching circuit 401 is inserted between a drain of the FET 405 and a LO terminal 401a, and has a series capacitor 401b, a transmission line 401c and an open stub 401d.

The bias circuit 402 has a capacitor 402b and a resistor 402c, and a gate bias voltage $V_G$ is applied to the bias circuit 402 through a bias terminal 402a.

The RF matching circuit 403 is inserted between the drain of the FET 405 and an RF terminal 403a. The RF matching circuit 403 has transmission lines 403c and 403d, and open stubs 403e and 403f.

The IF matching circuit 404 is inserted between the drain of the FET 405 and an IF terminal 404a. The IF matching circuit 404 has transmission lines 404c and 404d, and open stubs 403f, 4023g, 403h and 403i.

For comparison, for the same components of the resistive mixer 400 according to the current example as those of the resistive mixer 10 according to this embodiment, the same parameter values as those of the resistive mixer 10 described above are used.

In the following description of this embodiment, for ease of explanation, it is assumed that the transmission lines of the LO matching circuits 11 and 401, the RF matching circuits 13 and 403 and the IF matching circuits 14 and 404 of the resistive mixers 10 and 400 shown in FIGS. 4 and 5, respectively, have a conductor loss of 0.

Figure 6:
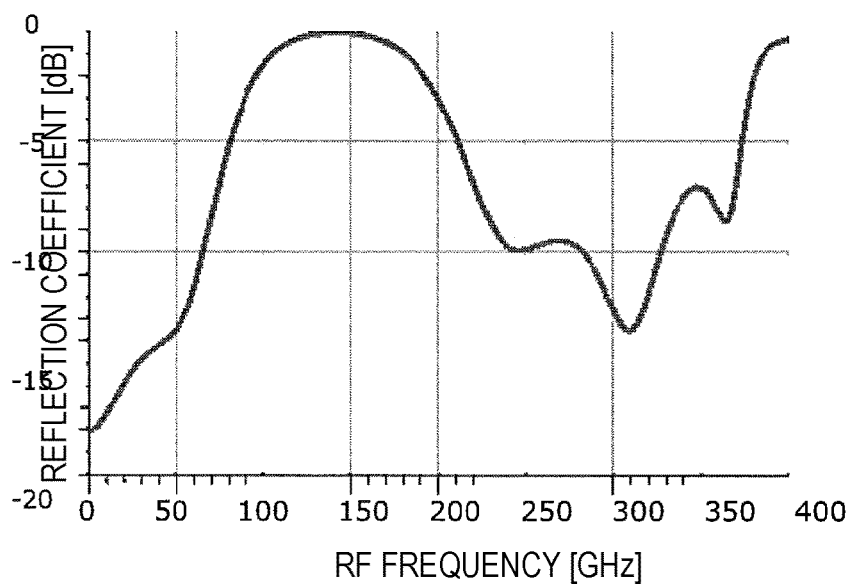
FIG. 6 is a graph for illustrating a reflection coefficient in the comparative example in FIG. 5.
Figure 7:
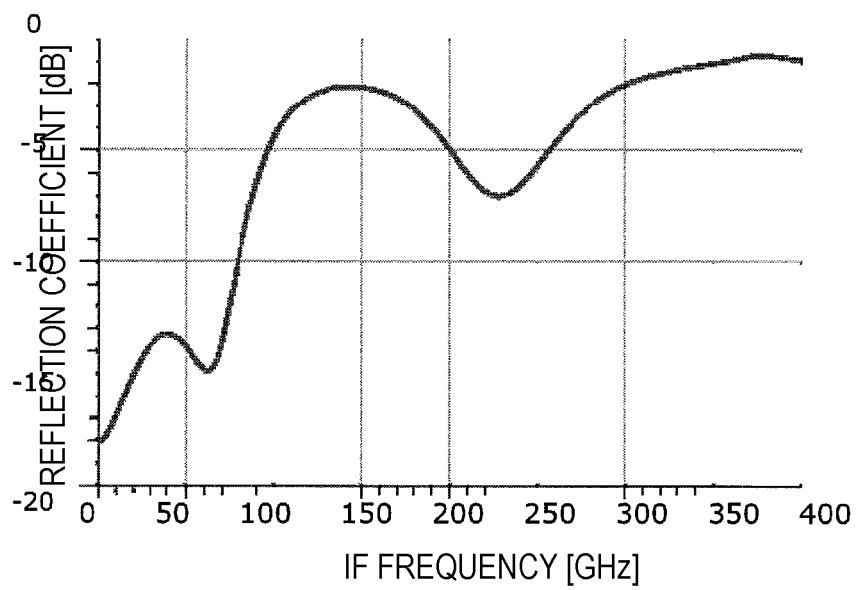
FIG. 7 is a graph for illustrating a reflection coefficient in the comparative example in FIG. 5.

FIGS. 6 and 7 show reflection coefficients of the RF terminal 403a and the IF terminal 404a of the resistive mixer 400 according to the current example shown in FIG. 5, respectively.

In FIG. 6, the horizontal axis indicates RF frequency, and the vertical axis indicates reflection coefficient. As described above, the design RF frequency of the resistive mixer 400 is 250 GHz to 300 GHz. As can be seen, around the design frequency, the reflection coefficient is equal to or less than −10 dB, and good matching is achieved.

In FIG. 7, the horizontal axis indicates IF frequency, and the vertical axis indicates reflection coefficient. As described above, the design IF frequency of the resistive mixer 400 is 10 GHz to 60 GHz. As can be seen, around the design frequency, again, the reflection coefficient is equal to or less than −10 dB, and good matching is achieved.

Figure 8:
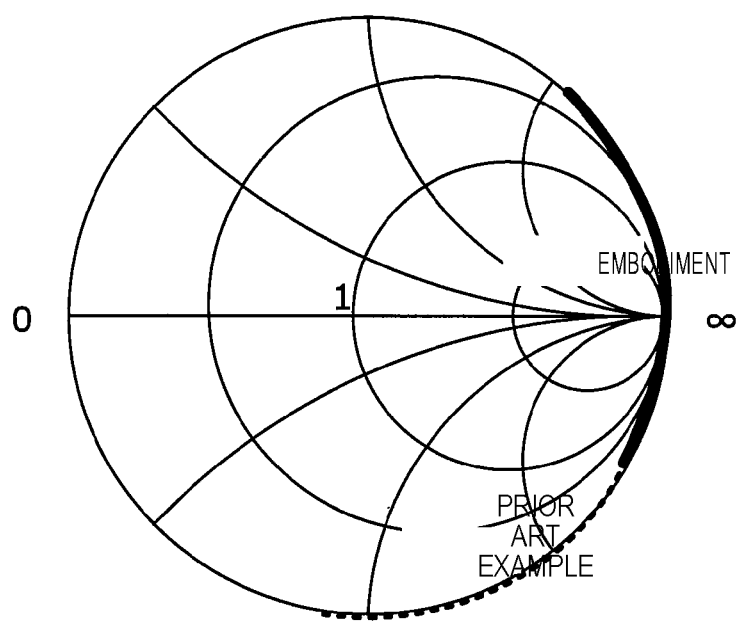
FIG. 8 is a chart for illustrating an effect of the resistive mixer according to the first embodiment.

FIG. 8 is a Smith chart showing the reflection coefficient of the IF matching circuit 14 of the resistive mixer 10 according to this embodiment shown in FIG. 4 at the RF frequency of the RF signal. The bold line in FIG. 8 indicates the reflection coefficient of the IF matching circuit 14. The dotted line in FIG. 8 indicates the reflection coefficient of the IF matching circuit 404 of the resistive mixer 400 according to the current example shown in FIG. 5.

As can be seen from FIG. 8, the impedance of the IF matching circuit 14 of the resistive mixer 10 according to this embodiment at the RF frequency assumes a value closer to the value in the open-circuit state than the impedance of the resistive mixer 400 according to the current example.

Figure 9:
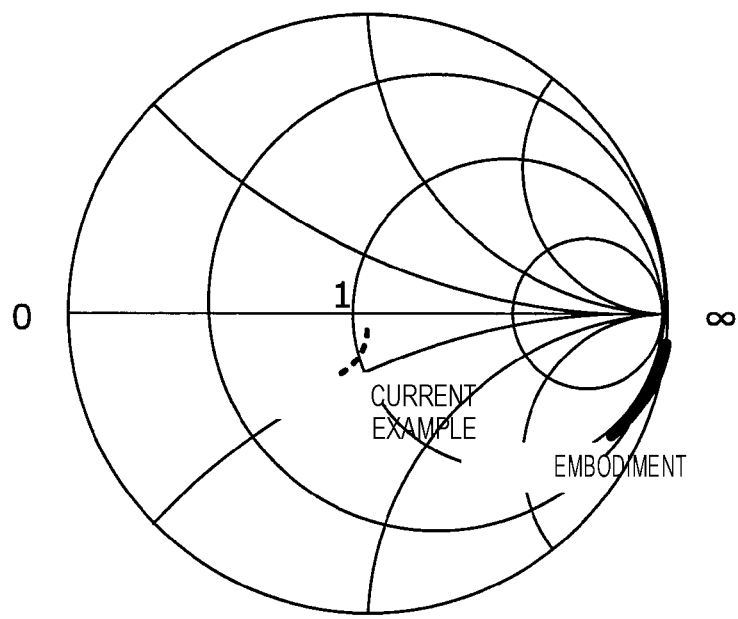
FIG. 9 is a chart for illustrating the effect of the resistive mixer according to the first embodiment.

FIG. 9 is a Smith chart showing the reflection coefficient of the RF matching circuit 13 of the resistive mixer 10 at the IF frequency. The bold line in FIG. 9 indicates the value for the resistive mixer 10 according to this embodiment, and the dotted line indicates the value for the resistive mixer 400 according to the current example.

As can be seen from FIG. 9, the impedance of the RF matching circuit 13 of the resistive mixer 10 according to this embodiment at the IF frequency assumes a value closer to the value in the open-circuit state than the impedance of the resistive mixer 400 according to the current example.

The resistive mixer 10 is characterized in that the impedance $Z_{14}$@RF of the IF matching circuit 14 seen from the RF signal and the impedance $Z_{13}$@IF of the RF matching circuit seen from the IF terminal 14a are both open-circuit. Therefore, as described above with reference to FIGS. 2 and 3, in each of the down conversion operation and the up conversion operation of the mixer circuit, the change of the value of the drain-source resistance $R_{ds}$ of the transistor can have more direct influence on the RF signal or IF signal.

Thus, the resistive mixer 10 according to this embodiment can achieve higher conversion gain than the resistive mixer 400 according to the current example.

Figure 10:
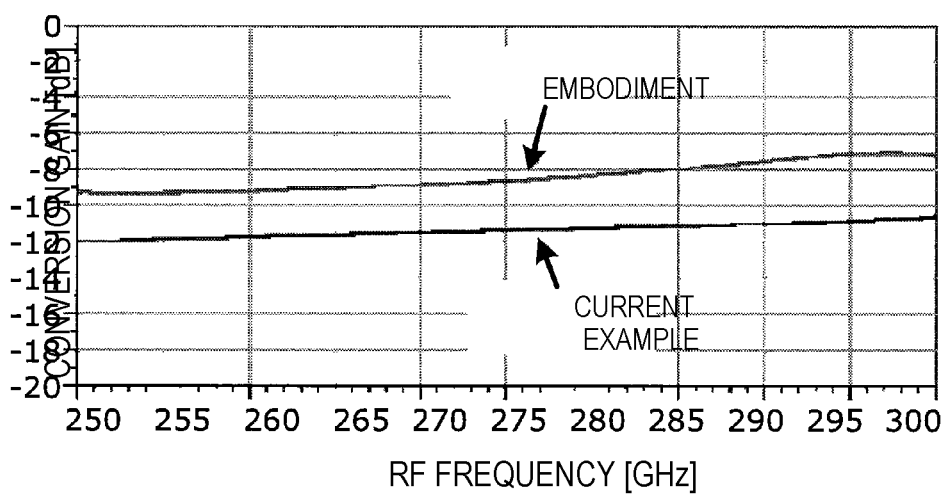
FIG. 10 is a graph for illustrating the effect of the resistive mixer according to the first embodiment.

Next, an RF frequency dependency of the conversion gain of the resistive mixer 10 according to this embodiment and the resistive mixer 400 according to the current example will be described with reference to FIG. 10. In FIG. 10, the horizontal axis indicates RF frequency, and the vertical axis indicates conversion gain.

Referring to FIG. 10, the conversion gain of the resistive mixer 10 shown as "EMBODIMENT" is higher than the conversion gain of the resistive mixer 400 shown as "CURRENT EXAMPLE" by 3 dB or more over the entire frequency band. This shows that the configuration of the resistive mixer 10 according to this embodiment makes a great contribution to the improvement of the conversion gain.

As described above, the resistive mixer 10 according to this embodiment has the effect of making the impedance of a coupler, a waveguide or a coaxial line connected to the IF terminal 14a or RF terminal 13a when the circuit is packaged harder to see. This effect will be described below with regard to an example where a well-known ridge coupler (not shown) is connected to the RF terminal 13a of the resistive mixer 10 according to this embodiment and the RF terminal 403a of the resistive mixer 400 according to the current example (see Patent Literature 1).

Figure 11:
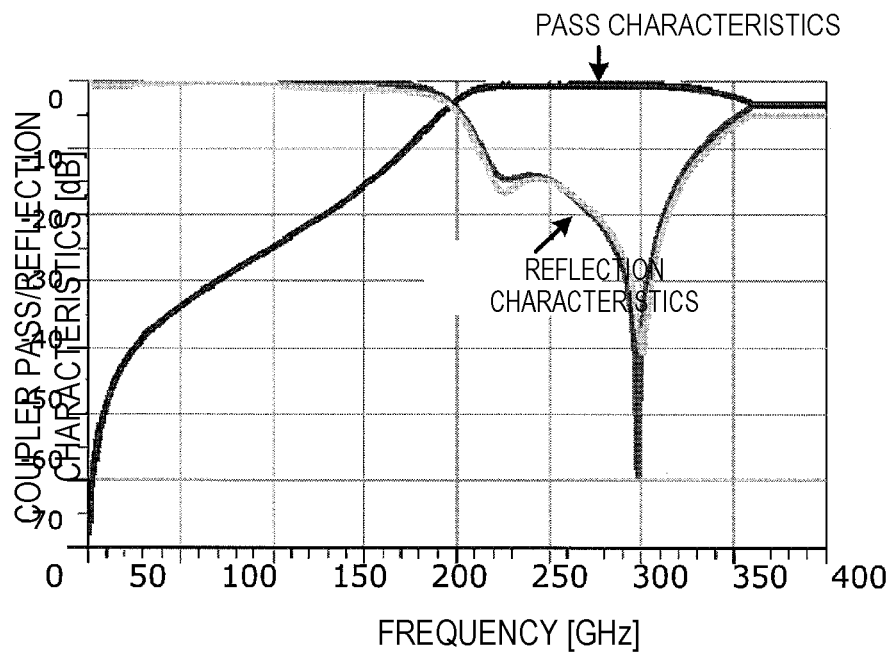
FIG. 11 is a graph for illustrating the effect of the resistive mixer according to the first embodiment.

The ridge coupler has the pass characteristics and reflection characteristics shown in FIG. 11. More specifically, the ridge coupler has very good pass characteristics in the RF frequency band because of the superior mode conversion characteristics from the waveguide to the integrated circuit. However, in the frequency band equal to or lower than 220 GHz, which is outside of the band of the waveguide, most signals are reflected.

When an element having such band characteristics is connected to the RF terminal 13a or 403a, if the RF matching circuit 13 or 403 is adequately cut off from the IF signal, the IF signal is reflected by the ridge coupler, and a standing wave is produced in the circuit. As a result, an unwanted ripple occurs in the frequency characteristics of the conversion gain of the mixer circuit.

Figure 12:
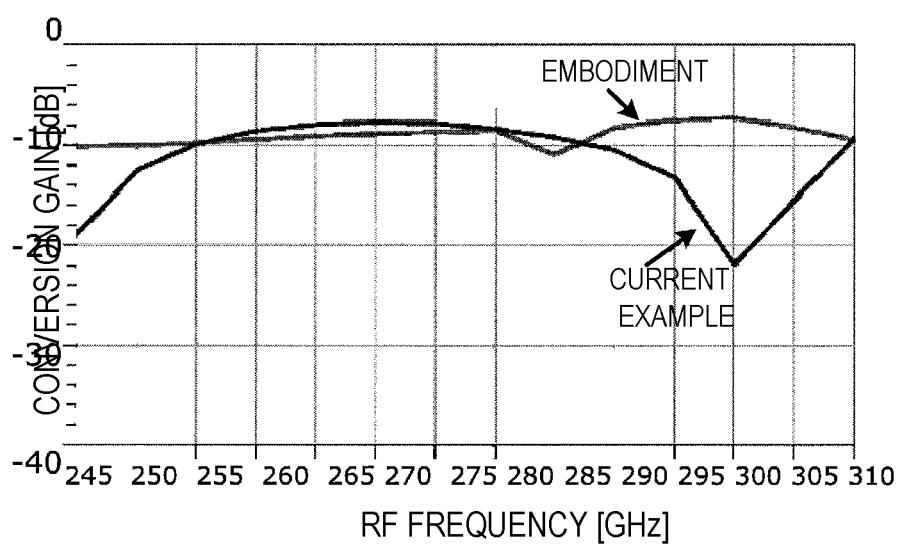
FIG. 12 is a graph for illustrating the effect of the resistive mixer according to the first embodiment.

FIG. 12 shows an RF frequency dependency of the conversion gain of the resistive mixer 10 according to this embodiment and the resistive mixer 400 according to the current example in the case where the ridge coupler described above is connected to each of the RF terminals 13a and 403a.

In FIG. 12, the horizontal axis indicates RF frequency, and the vertical axis indicates conversion gain. In the resistive mixer 400 shown as "CURRENT EXAMPLE", a large ripple occurs in the conversion gain as shown in FIG. 12. On the other hand, in the resistive mixer 10 shown as "EMBODIMENT", little ripple occurs, and flat frequency characteristics are achieved.

As described above, according to the first embodiment, the resistive mixer 10 is configured to make the impedance $Z_{14}$@RF of the IF matching circuit 14 seen from the RF signal and the impedance $Z_{13}$@IF of the RF matching circuit 13 seen from the IF terminal 14a open-circuit. Therefore, the resistive mixer 10 can have an improved conversion gain and be prevented from being degraded in characteristics when the resistive mixer 10 is packaged.

Therefore, if the resistive mixer 10 is used in a transceiver for radio communications, for example, the resistive mixer 10 has the effect of improving the data rate due to improvement of the SN ratio or the effect of extending the radio communication range.

In addition, since the resistive mixer 10 is prevented from being degraded in characteristics when the resistive mixer 10 is packaged, the portion of the matching circuits of the resistive mixer 10 does not need to be redesigned for packaging. As a result, the number of prototype circuits and the manufacturing cost can be reduced, which can make a great contribution to the reduction of the cost of the transceiver or other products.

Second Embodiment

Next, a second embodiment of the present invention will be described. In the following description, the same components as those in the first embodiment described above are denoted by the same reference numerals, and redundant descriptions thereof will be omitted.

The first embodiment has been described with regard to an example where the IF matching circuit 14 includes the quarter-wave line 14b and the quarter-wave open stub 14e that have a length equal to a quarter of the wavelength at the RF frequency, and the RF matching circuit 13 includes the series capacitor 13b.

According to the second embodiment, an RF matching circuit 23 includes a quarter-wave line 23a (third transmission line) and a quarter-wave open stub 23b (fourth transmission line) that have a length equal to a quarter of the wavelength at the IF frequency, instead of the series capacitor 13b. A resistive mixer 20 according to the second embodiment differs from the resistive mixer 10 according to the first embodiment in this respect. The following description will be focused on the difference.

Figure 13:
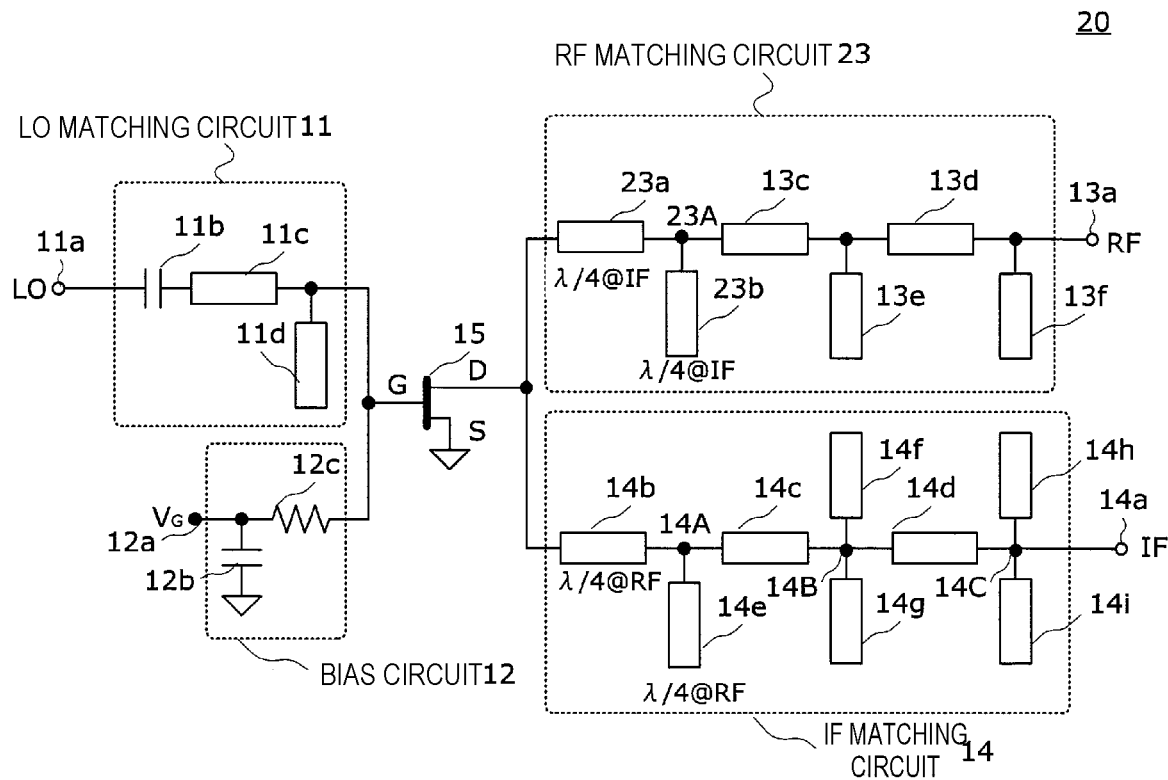
FIG. 13 is a diagram showing a configuration of a resistive mixer according to a second embodiment of the present invention.
Figure 14:
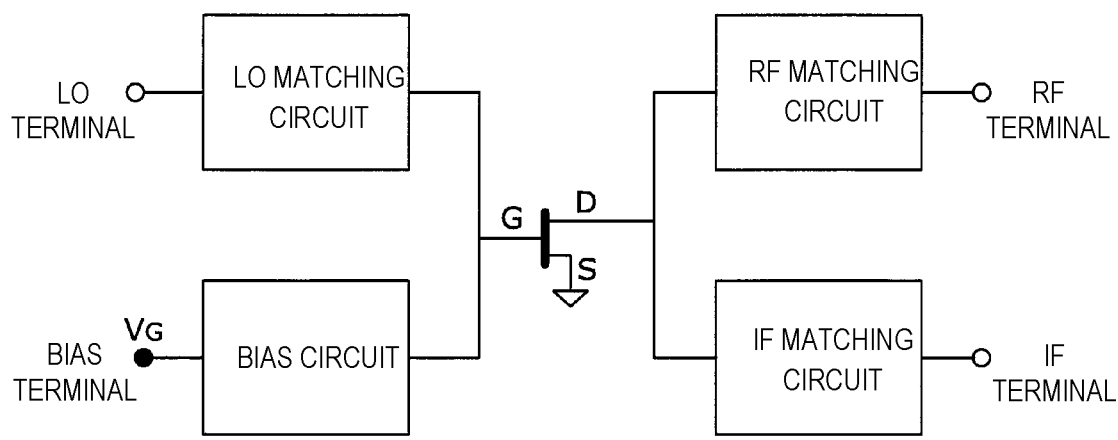
FIG. 14 is a block diagram showing an example of a configuration of a conventional resistive mixer.

FIG. 13 is a diagram showing an example of a configuration of the resistive mixer 20 according to this embodiment. As shown in FIG. 13, the resistive mixer 20 includes the LO matching circuit 11, the bias circuit 12, the RF matching circuit 23, the IF matching circuit 14 and the FET 15.

The RF matching circuit 23 is inserted between the drain of the FET 15 and the RF terminal 13a. The RF matching circuit 23 has the quarter-wave line 23a having a length equal to a quarter of the wavelength at the IF frequency between the drain of the FET 15 and the transmission line 13d. The quarter-wave open stub 23b having a length equal to a quarter of the wavelength at the IF frequency is connected to a connection point 23A at which the quarter-wave line 23a and the transmission line 13c are connected to each other.

Since the RF matching circuit 23 has the quarter-wave line 23a and the quarter-wave open stub 23b, the RF matching circuit 23 can cut off the IF signal from the RF matching circuit 23. The principle of this is the same as the case of the quarter-wave line 14b and the quarter-wave open stub 14e provided in the IF matching circuit 14, described with regard to the first embodiment.

In the first embodiment, the RF frequency and the IF frequency significantly differ from each other, and therefore, the fact that the value of the impedance of the series capacitor 13b significantly varies between the RF frequency and the IF frequency can be used. However, as the RF frequency and the IF frequency come close to each other to some extent, the value of the impedance of the series capacitor 13b does not significantly vary. Therefore, it is more difficult to cut off the RF matching circuit 13 from the IF signal.

According to this embodiment, since the RF matching circuit 23 also has the quarter-wave line 23a and the quarter-wave open stub 23b that have a length equal to a quarter of the wavelength at the IF frequency, the impedance of the IF matching circuit 14 seen from the RF signal and the impedance of the RF matching circuit 23 seen from the IF signal can be raised.

As described above, according to the second embodiment, since the RF matching circuit 23 also has the quarter-wave line 23a and the quarter-wave open stub 23b, even if the RF frequency and the IF frequency are close to each other to some extent, the resistive mixer 20 can have an improved conversion gain and be prevented from being degraded in characteristics when the resistive mixer 20 is packaged.

Although embodiments of the mixer circuit according to the present invention have been described above, the present invention is not limited to the embodiments described above, and various modifications can be made which can occur to those skilled in the art within the scope of the invention as set forth in the claims.

In the embodiments described above, the transistor used is an FET. However, a bipolar transistor can also be used.

The configurations of the RF matching circuit 13 and the IF matching circuit 14 in the embodiments described above are just examples, and other configurations are also possible in which the impedance of the RF matching circuit 13 seen from the IF signal is open-circuit, and the impedance of the IF matching circuit 14 seen from the RF signal is open-circuit.

REFERENCE SIGNS LIST 10, 20, 400 Resistive mixer
11, 401 LO matching circuit
12, 402 Bias circuit
13, 403 RF matching circuit
14, 404 IF matching circuit
15, 405 FET
11a, 401a LO terminal
11b, 13b, 401b Series capacitor
12b, 402b Capacitor
11c, 13c, 13d, 14c, 14d, 401c, 403c, 403d, 404c, 404d Transmission line
14b Quarter-wave line
14e Quarter-wave open stub
11d, 13e, 13f, 14g, 14h, 14i, 401d, 403e, 403f, 404f, 404g, 404h, 404i Open stub
12a, 402a Bias terminal
12c, 402c Resistor
13a, 403a RF terminal
14a, 404a IF terminal
15, 405 FET

The invention claimed is:

1. A mixer circuit, comprising:
a transistor comprising a control terminal, a first output terminal, and a second output terminal, wherein the second output terminal is grounded;
a local oscillation (LO) terminal connected to the control terminal and to which an LO signal is input;
a high frequency (RF) terminal connected to the first output terminal and from which a high-frequency signal is output;
an intermediate frequency (IF) terminal connected to the first output terminal and from which an IF signal is output;
an LO matching circuit connected between the control terminal and the LO terminal;
a bias circuit connected to the control terminal and applies a bias voltage to the control terminal;
an RF matching circuit connected between the first output terminal and the RF terminal, wherein the RF matching circuit comprises a first distributed constant circuit having a first plurality of transmission lines; and
an IF matching circuit connected between the first output terminal and the IF terminal, wherein the IF matching circuit comprises a second distributed constant circuit having a second plurality of transmission lines, wherein a first impedance of the RF matching circuit measured from the first output terminal at an intermediate frequency is open-circuit, and wherein a second impedance of the IF matching circuit measured from the first output terminal at an RF frequency is open-circuit.

2. The mixer circuit according to claim 1, wherein:
the RF matching circuit further comprises:
a series capacitor connected in series to the first distributed constant circuit, wherein the first output terminal of the transistor is connected to a first end of the series capacitor, and
the IF matching circuit further comprises:
a first transmission line that has a length equal to a quarter wavelength of the RF frequency, wherein the first transmission line is connected between the first output terminal of the transistor and the second distributed constant circuit; and
a second transmission line that has a length equal to the quarter wavelength of the RF frequency, wherein the second transmission line is located at a connection point at which the first transmission line is connected to the second distributed constant circuit.

3. The mixer circuit according to claim 2, wherein the second transmission line is open at one end.

4. The mixer circuit according to claim 1, wherein:
the RF matching circuit further comprises:
a third transmission line having a length equal to a quarter wavelength of the intermediate frequency, the third transmission line is between the first output terminal of the transistor and the first distributed constant circuit; and
a fourth transmission line having a length equal to the quarter wavelength of the intermediate frequency, the fourth transmission line is at a connection point at which the third transmission line is connected to the first distributed constant circuit; and
the IF matching circuit further comprises:
a first transmission line having a length equal to a quarter wavelength of the RF frequency, the first transmission line is between the first output terminal of the transistor and the second distributed constant circuit; and
a second transmission line having a length equal to a quarter wavelength of the RF frequency, the second transmission line is at a connection point at which the first transmission line is connected to the second distributed constant circuit.

5. The mixer circuit according to claim 4, wherein the fourth transmission line is open at one end, and wherein the second transmission line is open at one end.

6. The mixer circuit according to claim 1, wherein the first plurality of transmission lines comprises at least one transmission line that is open at one end.

7. The mixer circuit according to claim 1, wherein a second wherein the second plurality of transmission lines comprises at least one transmission line that is open at one end.

8. The mixer circuit according to claim 1, wherein the transistor is a field effect transistor.

9. A mixer circuit, comprising:
a transistor comprising a gate, a first output, and a second output;
a local oscillation (LO) terminal connected to the gate through an LO matching circuit;
a high frequency (RF) terminal connected to the first output through an RF matching circuit, wherein the RF matching circuit comprises a first distributed constant circuit having a first plurality of transmission lines, wherein a first impedance of the RF matching circuit measured from the first output at an intermediate frequency indicates an open-circuit;

an intermediate frequency (IF) terminal connected to the first output through an IF matching circuit, wherein the IF matching circuit comprises a second distributed constant circuit having a second plurality of transmission lines, and wherein a second impedance of the IF matching circuit measured from the first output at an RF frequency indicates an open-circuit; and a bias circuit connected to the gate.

10. The mixer circuit of claim 9, wherein the second output is grounded.

11. The mixer circuit of claim 9, wherein a LO signal is input into the LO terminal.

12. The mixer circuit of claim 9, wherein a high-frequency signal is output from the RF terminal.

13. The mixer circuit of claim 9, wherein an IF signal is output from the IF terminal.

14. The mixer circuit of claim 9, wherein the bias circuit applies a bias voltage to the gate.

15. The mixer circuit of claim 9, wherein the RF matching circuit further comprises:

a series capacitor, wherein a first end of the series capacitor is connected in series to the first distributed constant circuit, and the first output of the transistor is connected to a second end of the series capacitor.

16. The mixer circuit of claim 9, wherein the IF matching circuit further comprises:

a first transmission line that has a length equal to a quarter wavelength of the RF frequency, wherein the first transmission line is connected between the first output of the transistor and the second distributed constant circuit; and a second transmission line that has a length equal to the quarter wavelength of the RF frequency, wherein the second transmission line is located at a connection point at which the first transmission line is connected to the second distributed constant circuit, and wherein the second transmission line is open at one end.

17. The mixer circuit according to claim 9, wherein the RF matching circuit further comprises:

a third transmission line having a length equal to a quarter wavelength of the intermediate frequency, the third transmission line is between the first output of the transistor and the first distributed constant circuit; and a fourth transmission line having a length equal to the quarter wavelength of the intermediate frequency, the fourth transmission line is at a connection point at which the third transmission line is connected to the first distributed constant circuit, and the fourth transmission line is open at one end.

* * * * *